(12) United States Patent
Takahashi et al.

(10) Patent No.: US 9,406,524 B2
(45) Date of Patent: Aug. 2, 2016

(54) SUBSTRATE PROCESSING METHOD AND SUBSTRATE PROCESSING APPARATUS

(71) Applicant: TOKYO ELECTRON LIMITED, Tokyo (JP)

(72) Inventors: Hiroyuki Takahashi, Nirasaki (JP); Taechun Kwon, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/517,081

(22) Filed: Oct. 17, 2014

(65) Prior Publication Data

US 2015/0111388 A1 Apr. 23, 2015

(30) Foreign Application Priority Data

Oct. 17, 2013 (JP) ................................ 2013-216556

(51) Int. Cl.
  *H01L 21/302* (2006.01)
  *H01L 21/311* (2006.01)
  *H01L 21/67* (2006.01)

(52) U.S. Cl.
  CPC .... *H01L 21/31116* (2013.01); *H01L 21/67017* (2013.01); *H01L 21/67253* (2013.01)

(58) Field of Classification Search
  CPC ............ H01L 21/311; H01L 21/31116; H01L 21/67017; H01L 21/67253
  USPC .................. 48/689, 706; 216/37, 67; 118/723; 156/345.33; 438/689, 706
  See application file for complete search history.

(56) References Cited

U.S. PATENT DOCUMENTS

| 6,419,455 | B1 * | 7/2002 | Rousseau et al. ............... 417/36 |
| 7,641,451 | B2 * | 1/2010 | Lee ............................ 417/423.4 |
| 2004/0262254 | A1 | 12/2004 | Ozawa et al. |
| 2008/0286491 | A1 * | 11/2008 | Takahashi et al. ............ 427/569 |

(Continued)

FOREIGN PATENT DOCUMENTS

JP 2005039185 A 10/2005
JP 2008160000 A 10/2008

OTHER PUBLICATIONS

Ozawa et al.; English Abstract for JP2005039185; Work Processing Apparatus, Work Processing Method Therefor, Pressure Control Method, Work Carrying Method, and Carrying Apparatus; Oct. 2, 2005; http://www19.ipdl.inpit.go.jp.

(Continued)

*Primary Examiner* — Duy Deo
*Assistant Examiner* — Maki Angadi

(57) ABSTRACT

A substrate processing method for processing a substrate by supplying a processing gas into a processing chamber and allowing the processing gas to react on the substrate in the processing chamber by using a substrate processing apparatus includes the processing chamber accommodating the substrate, a processing gas supply unit for supplying the processing gas into the processing chamber, and a gas exhaust unit, for exhausting the processing chamber, having a turbo molecular pump. The method controls a processing uniformity by controlling a revolution speed of the turbo molecular pump while maintaining a pressure in the processing chamber to a predetermined level when by-products having a larger molecular mass compared to the processing gas are generated by the reaction of the processing gas.

5 Claims, 4 Drawing Sheets

(56) References Cited

U.S. PATENT DOCUMENTS

2009/0191340 A1* 7/2009 Tozawa .................... 427/255.39
2011/0035957 A1 2/2011 Muraki et al.

OTHER PUBLICATIONS

Muraki et al.; English Abstract for JP2008160000; Gas Processing Apparatus, Gas Processing Method, and Storage Medium; Oct. 7, 2008; http://www19.ipdl.inpit.go.jp.

* cited by examiner

SUBSTRATE PROCESSING METHOD AND SUBSTRATE PROCESSING APPARATUS

CROSS-REFERENCE TO RELATED APPLICATIONS

This application claims priority to Japanese Patent Application No. 2013-216556 filed on Oct. 17, 2013, the entire contents of which are incorporated herein by reference.

FIELD OF THE INVENTION

The present invention relates to a substrate processing method and a substrate processing apparatus which perform processing on a substrate.

BACKGROUND OF THE INVENTION

Recently, in a semiconductor device manufacturing process, a method referred to as chemical oxide removal (COR) attracts attention as a method for performing micro-etching instead of dry etching or wet etching.

As for the COR process, there is known an etching process for evaporating by-products mainly containing $(NH_4)_2SiF_6$ (AFS) by heating, the by-products being generated by adsorption of HF gas and $NH_3$ gas on a $SiO_2$ film formed on a surface of a semiconductor wafer as an object to be processed and reaction therebetween (see, e.g., Japanese Patent Application Publication Nos. 2005-39185 and 2008-160000).

Recently, the COR process is applied to etch Si of a poly-Si film or the like using $F_2$ gas and $NH_3$ gas. In that case as well, by-products same as the above by-products are generated and evaporated by heating.

However, in the above etching process, sufficient etching uniformity may not be obtained. Generally, in order to improve the etching uniformity, it is considered to control parameters such as a temperature, a pressure, a gas ratio, gas inlet distribution and the like. However, it has been found that it is difficult to sufficiently improve the etching uniformity by controlling the parameters in such a process that generates by-products having a large molecular mass.

SUMMARY OF THE INVENTION

In view of the above, the present invention provides a substrate processing method and a substrate processing apparatus which can ensure sufficient processing uniformity in a process, such as COR process that generates by-products having a larger molecular mass.

The present inventors have found, as a result of studies to solve the above problem, that in a process such as the COR process that generates by-products having a larger molecular mass compared to a processing gas, the existence of the by-products in the processing chamber affects the processing uniformity. The present inventors have also found that the processing uniformity can be improved by changing a ratio of the by-products in the processing chamber by controlling the revolution speed of a turbo molecular pump used for a gas exhaust unit.

In accordance with the present invention, there is provided a substrate processing method for processing a substrate by supplying a processing gas into a processing chamber and allowing the processing gas to react on the substrate in the processing chamber by using a substrate processing apparatus including the processing chamber accommodating the substrate, a processing gas supply unit for supplying the processing gas into the processing chamber, and a gas exhaust unit, for exhausting the processing chamber, having a turbo molecular pump, the method including: controlling a processing uniformity by, controlling a revolution speed of the turbo molecular pump while maintaining a pressure in the processing chamber to a predetermined level when by-products having a larger molecular mass compared to the processing gas are generated by the reaction of the processing gas.

In accordance with another embodiment of present invention, there is provided a substrate processing apparatus including: a processing chamber configured to accommodate a substrate therein; a processing gas supply unit configured to supply a processing gas into the processing chamber: a gas exhaust unit including an automatic pressure control valve for automatically controlling a pressure in the processing chamber and a turbo molecular pump for exhausting the processing chamber; and a controller configured to control a revolution speed of the turbo molecular pump, wherein when by-products having a larger molecular mass compared to the processing gas are generated by a reaction of the processing gas, the controller controls a processing uniformity by controlling the revolution speed of the turbo molecular pump while maintaining the pressure in the processing chamber to a predetermined level by using the automatic pressure control valve.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings. In the present embodiment, there will be described a case of using, as a substrate to be processed, a semiconductor wafer (hereinafter, simply referred to as "wafer") having on a surface thereof a silicon oxide film and performing non-plasma dry etching on the silicon oxide film on the surface of the wafer by using HF gas and $NH_3$ gas.

<Configuration of Processing System>

Figure 1:
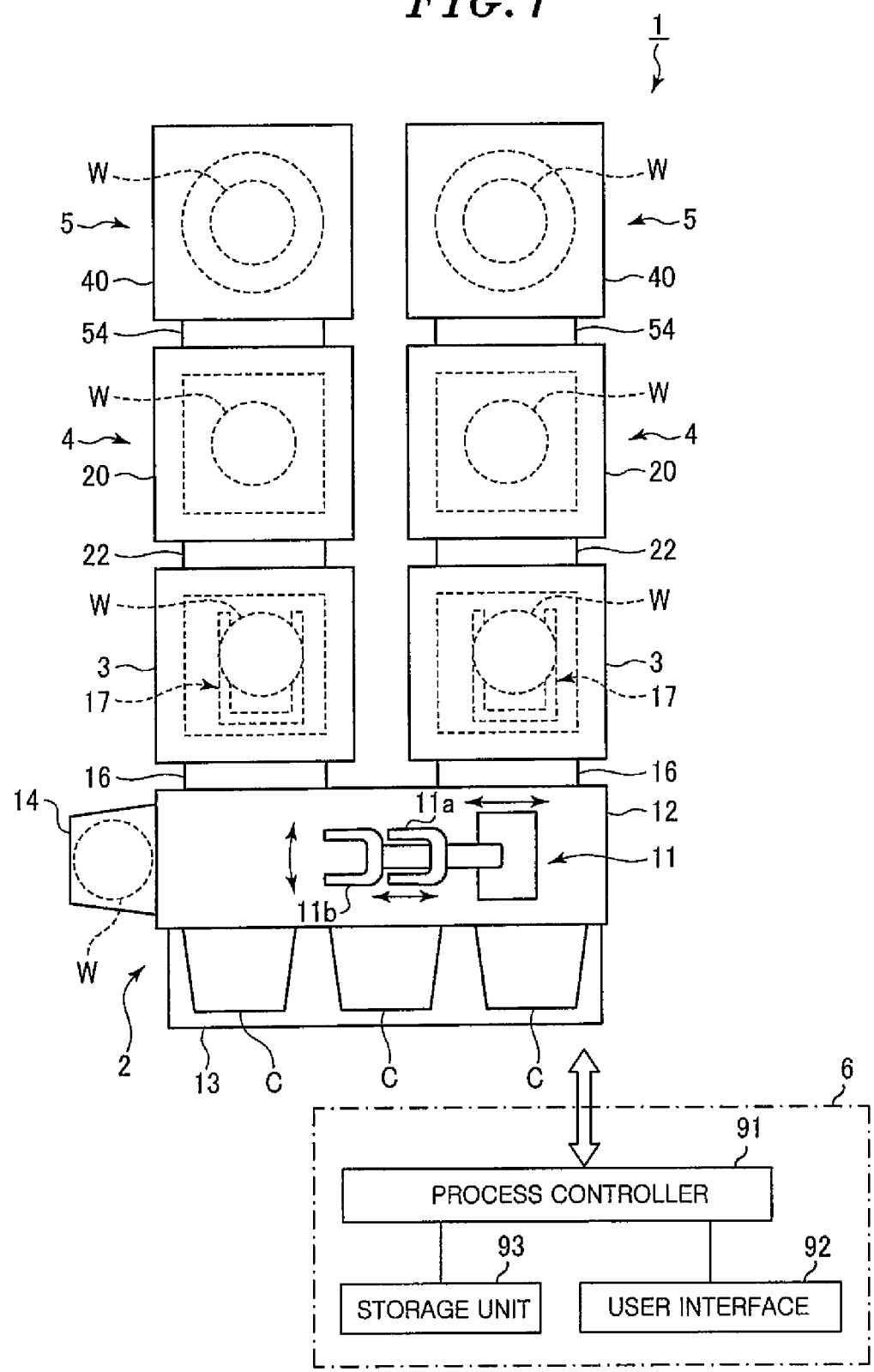
FIG. 1 schematically shows an example of a processing system including an etching apparatus in accordance with an embodiment of the present invention.

FIG. 1 schematically shows a processing system including an etching apparatus in accordance with an embodiment of the present invention. The processing system 1 includes: a loader module 2 through which a wafer W as a substrate to be processed is loaded and unloaded; two load-lock chambers 3 provided adjacent to the loader module 2; heat treatment apparatuses 4, provided adjacent to the load-lock chambers 3, for performing PHT (Post Heat Treatment) on wafers W; etching apparatuses 5, provided adjacent to the heat treatment apparatuses 4, for performing COR process as an etching process on the wafers W; and a control unit 6. The load-lock chambers 3, the heat treatment apparatuses 4 and the etching apparatuses 5 are disposed in that order on a straight line.

The loader module 2 includes a transfer chamber 12 having therein a first transfer mechanism 11 for transferring a wafer W. The first wafer transfer mechanism 11 has two transfer arms 11*a* and 11*b* for holding wafers W in a substantially horizontal direction. A mounting stage 13 is provided at one longitudinal side of the transfer chamber 12. A plurality of, e.g., three, carriers C, each being capable of accommodating therein a plurality of wafers W, is connected to the mounting stage 13. Further, an orienter 14 is provided adjacent to the transfer chamber 12 to perform position alignment by optically obtaining eccentricity by rotating the wafer W.

In the loader module 2, the wafer W is held by the transfer arms 11*a* and 11*b* and transferred to a desired position while moving straight on a substantially horizontal plane and vertically by the first wafer transfer mechanism 11. Further, the wafer W is loaded and unloaded by the extension/contraction of the transfer arms 11*a* and 11*b* with respect to the carrier C on the mounting stage 13, the orienter 14, and the load-lock chambers 3.

The load-lock chambers 3 are connected to the transfer chamber 12 via gate valves 16. A second wafer transfer mechanism 17 for transferring a wafer W is provided in each of the load-lock chambers 3. Further, the load-lock chambers 3 can be evacuated to a predetermined vacuum level.

The second wafer transfer mechanism 17 has a multi-joint arm structure and a pick for holding a wafer W in a substantially horizontal direction. In the second wafer transfer mechanism 17, the pick is positioned inside the load-lock chamber 3 in a state where the multi-joint arm is contracted; the pick reaches the heat treatment apparatus 4 by extending the multi-joint arm; and the pick reaches the etching apparatus 5 by further extending the multi-joint arm. In this manner, the wafer W can be transferred between the load-lock chambers 3, the heat treatment apparatuses 4 and the etching apparatuses 5.

The heat treatment apparatus 4 includes a chamber 20. The heat treatment apparatus 4 heats the wafer W on a mounting table (not shown) having therein a heater to a predetermined temperature. The chamber 20 is connected to the load-lock chamber 3 via a gate valve 22.

The etching apparatus 5 etches the silicon oxide film on the surface of the wafer W in the chamber 40. The chamber 40 is connected to the chamber 20 of the heat treatment apparatus 4 via a gate valve 54. The etching apparatus 5 will be described in detail later.

The control unit 6 includes a process controller 91 having a microprocessor (computer) for controlling components of the processing system 1. The process controller 91 is connected to a user interface 92 having a keyboard that is used for an operator to input commands in order to manage the processing system 1, a display for visually displaying an operation state of the processing system 1, and the like. The process controller 91 is also connected to a storage unit 93 that stores a control program for realizing various processes, e.g., supply of the processing gas, exhaust of the chamber and the like in the etching apparatus 5 to be described later, which are executed in the processing system 1 under the control of the process controller, and a control program, i.e., a processing recipe, for executing predetermined processes of the components of the processing system 1 in accordance with processing conditions, various database and the like. The recipe is stored in a proper storage medium (not shown) of the storage unit 93. If necessary, a recipe may be read out from the storage unit 93 and executed in the process controller 91. Accordingly, a desired process is performed in the processing system 1 under the control of the process controller 91.

In the processing system 1, a wafer W having on a surface thereof a silicon oxide film to be etched is used. A plurality of such wafers W are transferred to the processing system 1 while being accommodated in a carrier C. In the processing system 1, the gate valve 16 of an atmospheric side is opened, and a single wafer W is transferred from the carrier C of the loader module 2 to the load-lock chamber 3 by one of the transfer arms 11*a* and 11*b* of the first wafer transfer mechanism 11 and delivered to the pick of the second wafer transfer mechanism 17 in the load-lock chamber 3.

Next, the atmospheric side gate valve 16 is closed to evacuate the load-lock chamber 3. Then, the gate valve 54 is opened, and the pick is extended to the etching apparatus 5 to transfer the wafer W to the etching apparatus 5.

Thereafter, the pick is retreated to the load-lock chamber 3 and the gate valve 54 is closed. As will be described later, the etching process is carried out by HF gas and NH$_3$ gas in the etching apparatus 5.

Upon completion of the etching process, the gate valves 22 and 54 are opened, and the etched wafer W is transferred to the heat treatment apparatus 4 by the pick of the second wafer transfer mechanism 17. The wafer W on the mounting table is heated by the heater while introducing an inert gas into the chamber 20. As a consequence, by-products generated by the etching are removed.

Upon completion of the heat treatment in the heat treatment apparatus 4, the gate valve 22 is opened, and the etched wafer W on the mounting table is retreated to the load-lock chamber 3 by the pick of the second wafer transfer mechanism 17. Then, the wafer W is returned to the carrier C by one of the transfer arms 11*a* and 11*b* of the first wafer transfer mechanism 11. In this manner, the processing of a single wafer is completed.

<Etching Apparatus>

Figure 2:
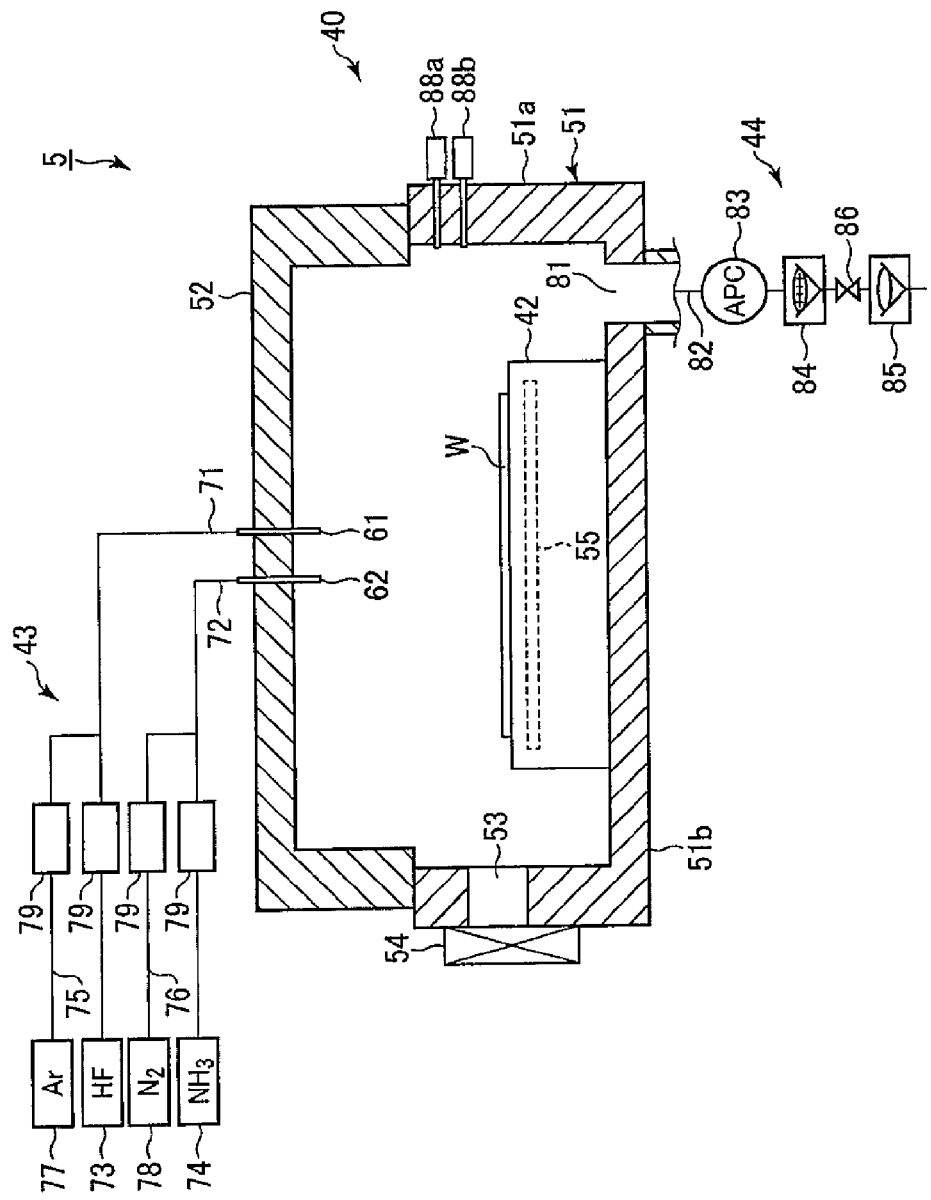
FIG. 2 is a cross sectional view showing the etching apparatus provided at the processing system shown in FIG. 1.

Hereinafter, the etching apparatus 5 will be described. FIG. 2 is a cross sectional view of the etching apparatus 5. The etching apparatus 5 includes: an airtight chamber 40; a mounting table 42 provided in the chamber 40, for substantially horizontally mounting thereon a wafer W as a substrate; a gas supply unit 43 for supplying an etching gas into the chamber 40; and a gas exhaust unit 44 for exhausting the chamber 40.

The chamber 40 includes a chamber main body 51 and a lid 52. The chamber main body 51 has a substantially cylindrical sidewall 51*a*, a bottom wall 51*b*, and an upper opening. The upper opening is blocked by the lid 52. A seal member (not shown) seals a gap between the sidewall 51*a* and the lid 52, so that airtightness in the chamber 40 is ensured. A first and a second gas introduction nozzle 61 and 62 are inserted into the chamber 40 through the ceiling wall of the lid 52.

A loading/unloading port 53 through which a wafer W is loaded into and unloaded from the chamber 40 of the etching apparatus 5 is provided at the sidewall 51*a*. The loading/unloading port 53 can be opened/closed by the gate valve 54.

The mounting table 42 has a substantially circular shape when seen from the top and is fixed to the bottom wall 51*b* of the chamber 40. The mounting table 42 has therein a temperature adjuster 55 for adjusting a temperature of the mounting table 42. The temperature adjuster 55 has a conduit through which a temperature control medium (e.g., water or the like) circulates. By exchanging heat with the temperature control medium flowing in the conduit, the temperature of the mounting table 42 is controlled and, further, the temperature of the wafer W on the mounting table 42 is controlled.

The gas supply unit 43 includes a first and a second gas supply line 71 and 72 connected to the first and the second gas introduction nozzle 61 and 62, respectively. The gas supply unit 43 further includes a HF gas supply source 73 and a $NH_3$ gas supply source 74 connected to the first and the second gas supply line 71 and 72, respectively. Further, a third gas supply line 75 is connected to the first gas supply line 71, and a fourth gas supply line 76 is connected to the second gas supply line 72. The third and the fourth gas supply line 75 and 76 are connected to an Ar gas supply source 77 and an $N_2$ gas supply source 78, respectively. A flow rate controller 79 for controlling a flow rate and opening/closing a flow path is provided at each of the first to the fourth gas supply lines 71, 72, 75 and 76. The flow rate controller 79 includes, e.g., an opening/closing valve and a mass flow controller.

HF gas and Ar gas are injected into the chamber 40 through the first gas supply line 71 and the first gas introduction nozzle 61. $NH_3$ gas and $N_2$ gas are injected into the chamber 40 through the second gas supply line 72 and the second gas introduction nozzle 62. Further, the gases may be injected in a shower shape by using a shower plate.

Among the above gases, HF gas and $NH_3$ gas serve as etching gases and are mixed in the chamber 40. Ar gas and $N_2$ gas serve as dilution gases. HF gas and $NH_3$ gas serving as etching gases and Ar gas and $N_2$ gas serving as dilution gases are introduced into the chamber 40 at predetermined flow rates. HF gas and $NH_3$ gas react with a silicon oxide film ($SiO_2$) formed on the surface of the wafer W while maintaining the pressure in the chamber 40 at a predetermined level. Accordingly, ammonium fluorosilicate (AFS) is generated as a by-product.

As for the dilution gas, either one of Ar gas or $N_2$ gas may be used. Another inert gas may be used as the dilution gas. Further, two or more gases of Ar gas, $N_2$ gas and another inert gas may be used as the dilution gas.

The gas exhaust unit 44 includes a gas exhaust line 82 connected to a gas exhaust port 81 formed in the bottom wall 51b of the chamber 40, an automatic pressure control valve (APC) 83 for controlling a pressure in the chamber 40, a turbo molecular pump 84, and a dry pump 85. The APC 83, the turbo molecular pump 84 and the dry pump 85 are provided at the gas exhaust line 82 in that order from the gas exhaust port 81 side. An opening/closing valve 86 is provided between the turbo molecular pump 84 and the dry pump 85. The dry pump 85 is an auxiliary pump for rough pumping and the turbo molecular pump 84 is a main pump for controlling a vacuum degree.

Figure 3:
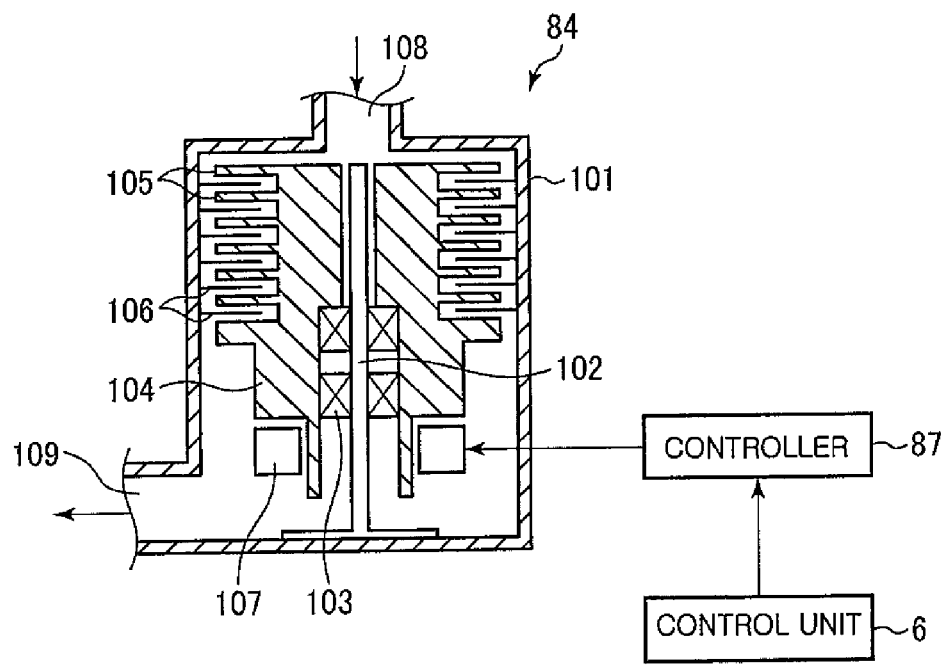
FIG. 3 is a cross sectional view showing a schematic configuration of a turbo molecular pump used for a gas exhaust unit of the etching apparatus.

As shown in FIG. 3, the turbo molecular pump 84 includes a housing 101, a stator 102 serving as a central axis in the housing 101, a rotor 104 rotatably provided through a bearing 103, a plurality of rotor blades 105 provided at an upper portion of the rotor 104, a plurality of stator blades 106 provided at an upper portion of the housing 101, and a motor 107 for rotating the rotor 104. A gas inlet port 108 is provided at a ceiling wall of the housing 101, and a gas outlet port 109 is provided at a lower portion of the sidewall of the housing 101. Further, the rotor blades 105 are provided between the adjacent stator blades 106 alternately.

Thus, when the rotor 107 is rotated by the motor 107, the rotor blades 105 rotate at a high speed with respect to the stator blades 106. Accordingly, a gas in the chamber 40 is sucked through the gas exhaust line 82 and the gas inlet port 108 and discharged to the gas exhaust line 82 of the downstream side through the gas outlet port 109. Hence, the chamber 40 can be exhausted to a high vacuum level. Further, the revolution speed of the turbo molecular pump 84 can be controlled by the controller 87 based on an instruction from the control unit 6. The revolution speed can also be controlled by an operator, not based on the instruction from the control unit 6.

Two capacitance manometers 88a and 88b for a high pressure and a low pressure which serve as pressure gauges for measuring a pressure in the chamber 40 are provided at the sidewall of the chamber 40. The APC valve 83 is configured to operate based on a pressure detected by the capacitance manometers 88a and 88b. A temperature sensor (not shown) is provided near the surface of the mounting table 42.

In the etching apparatus configured as described above, first, the gate valve 54 is opened, and a wafer W having on a surface thereof a silicon oxide film to be etched is loaded into the chamber 40 from the loading/unloading port 53 and mounted on the mounting table 42 by the pick of the second wafer transfer mechanism 17 in the load-lock chamber 3. Next, the pick is returned to the load-lock chamber 3, and the gate valve 54 is closed. Accordingly, the chamber 40 is airtightly sealed. In that state, the etching process is carried out.

Figure 4:
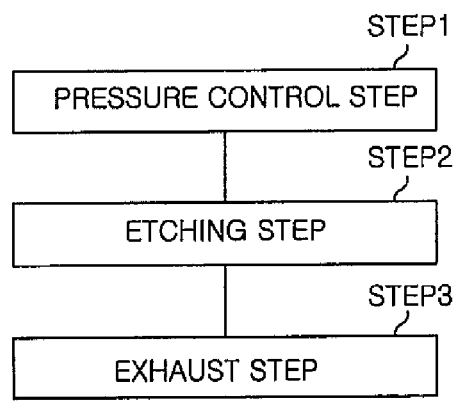
FIG. 4 is a flowchart of processes of an etching method.

As shown in FIG. 4, the etching process includes a pressure control step (step 1), an etching step (step 2), and an exhaust step (step 3).

In the pressure control step of the step 1, $NH_3$ gas and $N_2$ gas from the gas supply unit 43 are introduced into the chamber 40 through the second gas supply line 72 and the second gas introduction nozzle 62 and the chamber 40 is exhausted by using the turbo molecular pump 85 while controlling a gas exhaust amount by the APC valve 83, thereby controlling a pressure in the chamber 40. Further, the dry pump 85 is used for rough pumping in an atmospheric pressure state for maintenance purposes or the like. During consecutive processing, the dry pump 85 is constantly driven as a backup pump of the turbo molecular pump 84 to decrease a back pressure of the turbo molecular pump 84.

In the etching step of the step 2, after the pressure control step, HF gas and Ar gas are introduced, in addition to $NH_3$ gas and $N_2$ gas, into the chamber 40 through the first gas supply line 71 and the first gas introduction nozzle 61 to perform etching. At this time, the exhaust operation using the turbo molecular pump 84 is continued while controlling a pressure in the chamber 40 to a predetermined level by the APC valve 83.

By supplying HF gas and $NH_3$ gas into the chamber 40, the silicon oxide film on the surface of the wafer W is etched by chemical reaction with molecules of hydrogen fluoride gas and molecules of ammonia gas. At this time, by-products mainly formed of AFS are held on the surface of the wafer W.

In the exhaust step of the step 3, after the etching step is completed, the chamber 40 is exhausted by the turbo molecular pump 84 while introducing Ar gas or $N_2$ gas into the chamber 40.

Upon completion of the etching process, the gate valve 54 is opened, and the etched wafer W on the mounting table 42 is unloaded from the chamber 40 by the pick of the second wafer transfer mechanism 17. Thereafter, as described above, the wafer W is transferred to the chamber 20 of the heat treatment apparatus 4, and the by-products adhered to the wafer W are sublimated.

Meanwhile, the COR process generates by-products having a larger molecular mass and mainly containing AFS by reaction between HF gas and $NH_3$ gas and the silicon oxide film. Therefore, if the by-products are sublimated and exists in the chamber 40, the diffusion of HF gas and $NH_3$ gas as etching gases in the chamber 40 is disturbed. Accordingly, even if parameters such as a temperature, a pressure, a gas ratio, gas inlet distribution and the like are controlled, it is difficult to improve the etching uniformity.

In the present embodiment, the revolution speed of the turbo molecular pump 84 is considered to improve the etching uniformity. Generally, the revolution speed of the turbo molecular pump 84 can be controlled to initially control the gas exhaust amount in an initial stage. Since it is conventional to set the revolution speed to a maximum level, it is not considered to control the revolution speed of the turbo molecular pump 84 to improve the etching uniformity.

However, it has been found that a ratio of gases including by-products can be changed by controlling the revolution speed of the turbo molecular pump 84. In other words, as the revolution speed of the turbo molecular pump is increased, the gas suction amount is increased. At this time, light molecules, i.e., molecules having a smaller molecular mass, are relatively easily attracted compared to heavy molecules, i.e., molecules having a larger molecular mass, so that the ratio of the molecules having a larger molecular mass is increased. Meanwhile, as the revolution speed is decreased, the gas suction amount is decreased, whereas the ratio of molecules having a smaller molecular mass is increased. Therefore, when by-products mainly containing AFS having a larger molecular mass compared to HF gas and $NH_3$ gas serving as etching gases are generated as in the present embodiment, if the etching process is performed while maximizing the revolution speed of the turbo molecular pump as in the conventional case, the ratio of the by-products having a larger molecular mass becomes relatively high, which makes uniform diffusion of HF gas and $NH_3$ gas difficult.

Therefore, in the present embodiment, the etching uniformity is controlled by changing the ratio of the etching gases and the by-products by controlling the revolution speed of the turbo molecular pump 84 while maintaining the pressure in the chamber 40 at a predetermined level. Since the pressure in the chamber is controlled by the APC valve, the pressure in the chamber is not changed even if the gas suction amount is changed by changing the revolution speed of the turbo molecular pump 84.

Specifically, the etching uniformity is improved by decreasing the revolution speed of the turbo molecular pump 84, without maximizing the revolution speed of the turbo molecular pump 84 as in the conventional case, to a predetermined level at which the ratio of the by-products becomes relatively low and uniform etching is performed. At this time, the ratio of the by-products becomes relatively low, so that the etching amount is also increased. Therefore, it is preferable to decrease the revolution speed of the turbo molecular pump 84 to a lower level.

At this time, the revolution speed of the turbo molecular pump 84 is added as a parameter to the recipe, and an optimal revolution speed that has been previously obtained is stored for each recipe. The revolution speed of the turbo molecular pump 84 may be controlled based on such an optimal revolution speed. Or, an operator may control the revolution speed of the turbo molecular pump 84 to an optimal level.

Conventionally, the revolution speed of the turbo molecular pump 84 is not used as a parameter for the etching uniformity. However, by using the revolution speed of the turbo molecular pump 84 as the parameter, desired etching uniformity can be obtained even under the conventional conditions that the etching uniformity is not obtained.

In the etching step, the revolution speed of the turbo molecular pump 84 is set to a predetermined revolution speed smaller than the maximum level. However, in the exhaust step, the exhaust operation needs to be performed in a short period of time by fully opening the APC valve. Therefore, it is preferable to increase suction force by increasing the revolution speed of the turbo molecular pump 84. Therefore, it is preferable to control the revolution speed of the turbo molecular pump 84 to a level at which the etching uniformity is obtained until the etching step is completed and considerably increase the revolution speed in the exhaust step. It is most preferable to maximize the revolution speed in the exhaust step.

<Test Example>

Hereinafter, a test example that has examined the effect of the present invention will be described.

In the test example, a silicon oxide film on a silicon substrate was etched by HF gas and $NH_3$ gas by using the etching apparatus configured as shown in FIG. 2. At this time, the pressure in the chamber is controlled to 600 mTorr by the APC valve, and the revolution speed of the turbo molecular pump was changed. Other etching conditions were set as follows: a mounting table temperature: 75° C.; HF gas flow rate: 200 sccm, $NH_3$ gas flow rate: 200 sccm, Ar gas flow rate: 100 sccm, $N_2$ gas flow rate: 0 sccm.

Figure 5:
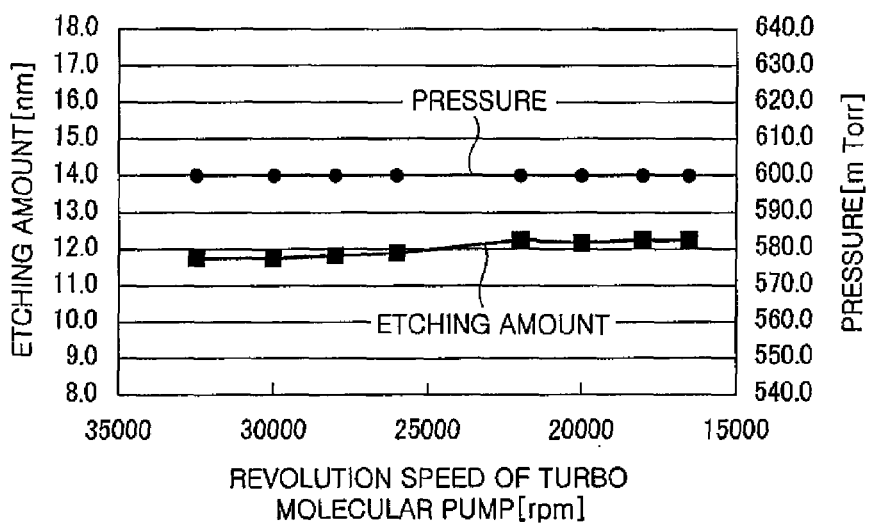
FIG. 5 shows relationship between an etching amount and the revolution speed of the turbo molecular pump in a test example.
Figure 6:
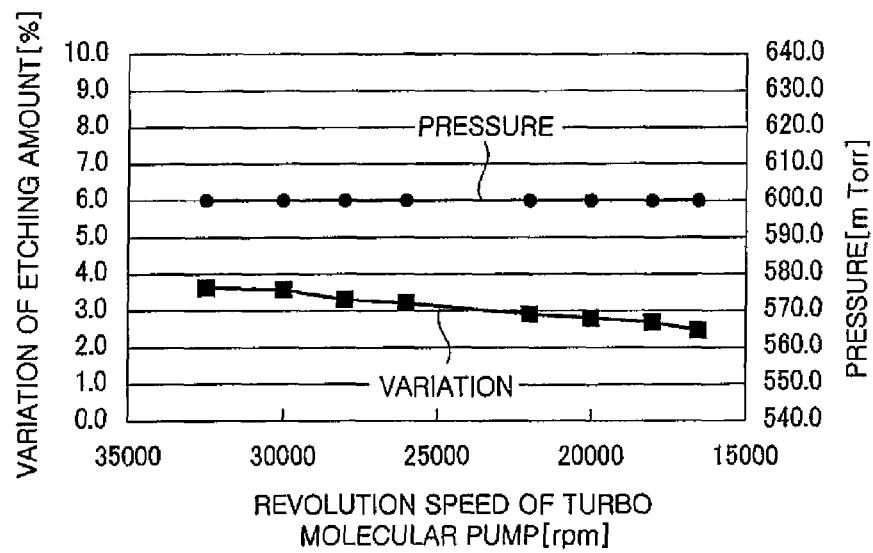
FIG. 6 shows relationship between etching uniformity (variation) and the revolution speed of the turbo molecular pump in the test example.

FIG. 5 shows relationship between the etching amount and the revolution speed of the turbo molecular pump. FIG. 6 shows relationship between etching uniformity (variation) and the revolution speed of the turbo molecular pump. The pressure in the chamber is illustrated in both drawings.

As shown in FIGS. 5 and 6, although the pressure in the chamber is not changed, as the revolution speed of the turbo molecular pump is decreased, the etching amount is increased and the etching variation is decreased (the etching uniformity is improved). When the revolution speed of the turbo molecular pump was maximum, i.e., 33000 rpm, the etching amount was 11.8 nm and the variation was 3.8%. When the revolution speed was 22000 rpm, the etching amount was 12.2 nm and the variation was 3.0%. When the revolution speed was 6000 rpm, the etching amount was 12.2 nm and the variation was 2.4%.

<Other Application of Present Invention>

The present invention may be variously modified without being limited to the above embodiments. For example, the above embodiment has described the case of etching the silicon oxide film by using, as an etching gas, HF gas and $NH_3$ gas. However, even in the case of etching silicon by using $F_2$ gas and $NH_3$ gas, by-products mainly containing AFS having a larger molecular mass compared to the etching gas are generated and the same effect as that of the above embodiment can be obtained. In other words, the present invention can be applied to the case of etching a silicon-containing film by using an etching gas containing fluorine, hydrogen and nitrogen and generating by-products mainly containing AFS having a larger molecular mass than the etching gas.

The present invention can be applied to the case of generating by-products having a larger molecular mass compared to the etching gas without being limited to the case of etching a silicon oxide film by using HF gas and $NH_3$ gas or the case of etching silicon by using $F_2$ gas and $NH_3$ gas. Further, the present invention can also be applied to other processes such as film formation and the like as long as by-products having a larger molecular mass compared to the processing gas are generated.

The apparatus of the above embodiment is merely an example, and the etching method of the present invention can be implemented by various apparatuses. Further, although the case of using a semiconductor wafer as a substrate to be processed has been described, the substrate to be processed is not limited to the semiconductor wafer and may also be another substrate such as a FPD (Flat Panel Display) substrate represented by an LCD (Liquid Crystal Display), a ceramic substrate or the like.

While the invention has been shown and described with respect to the embodiments, it will be understood by those skilled in the art that various changes and modifications may be made without departing from the scope of the invention as defined in the following claims.

What is claimed is:

1. A substrate processing method for use with a substrate processing apparatus, the substrate processing apparatus comprising: a processing chamber, a processing gas supply unit for supplying a processing gas into the processing chamber, and a gas exhaust unit for exhausting the processing chamber, wherein the gas exhaust unit comprises a turbo molecular pump and an automatic pressure control valve, the method comprising:

loading a substrate into the processing chamber;

processing the substrate by supplying the processing gas into the processing chamber and causing the processing gas to react on the substrate in the processing chamber, wherein during said processing the substrate, by-products having larger molecular masses than the processing gas are generated; and controlling, during said processing the substrate, a processing uniformity by setting a revolution speed of the turbo molecular pump to a lower level than a maximum level while maintaining a pressure in the processing chamber to a predetermined level by controlling a gas exhaust amount using the automatic pressure control valve, wherein by said controlling the processing uniformity, a partial pressure of the by-products during said processing the substrate is lower than that in a case where the revolution speed of the turbo molecular pump is set to the maximum level while maintaining the pressure in the processing chamber to the predetermined level by controlling the gas exhaust amount using the automatic pressure control valve, so that the processing uniformity is improved during said processing the substrate.

2. The substrate processing method of claim 1, further comprising:

exhausting the processing chamber without supplying the processing gas into the processing chamber, wherein the revolution speed of the turbo molecular pump in said exhausting the processing chamber without supplying the processing gas into the processing chamber is set to be greater than that of the turbo molecular pump in said processing the substrate.

3. The substrate processing method of claim 1, wherein an optimal revolution speed of the turbo molecular pump is operable to improve the processing uniformity and correspond to each predetermined pressure level in the processing chamber, wherein the optimal revolution speed is predetermined based on processing conditions and said processing the substrate is performed while setting the revolution speed of the turbo molecular pump to the optimal revolution speed.

4. The substrate processing method of claim 1, wherein said processing the substrate comprises an etching process of etching a preexisting film on the substrate by using an etching gas as the processing gas.

5. The substrate processing method of claim 4, wherein: the etching gas comprises fluorine, hydrogen and nitrogen; the preexisting film is a silicon-containing film; and the by-products comprise ammonium fluorosilicate.

* * * * *